United States Patent
Park et al.

(10) Patent No.: US 7,585,710 B2
(45) Date of Patent: Sep. 8, 2009

(54) METHODS OF FORMING ELECTRONIC DEVICES HAVING PARTIALLY ELEVATED SOURCE/DRAIN STRUCTURES

(75) Inventors: Min-Cheol Park, Seoul (KR); Sung-Hoi Hur, Seoul (KR)

(73) Assignee: Samsung Electronics Co, Ltd., Gyeonggi-do (KR)

( * ) Notice: Subject to any disclaimer, the term of this patent is extended or adjusted under 35 U.S.C. 154(b) by 258 days.

(21) Appl. No.: 11/638,775

(22) Filed: Dec. 14, 2006

(65) Prior Publication Data

US 2007/0090466 A1    Apr. 26, 2007

Related U.S. Application Data

(62) Division of application No. 11/020,311, filed on Dec. 22, 2004.

(51) Int. Cl.
*H01L 29/72* (2006.01)
(52) U.S. Cl. .................. 438/151; 438/197; 438/672; 438/675; 257/330
(58) Field of Classification Search .............. 257/330; 438/151, 197, 672, 375
See application file for complete search history.

(56) References Cited

U.S. PATENT DOCUMENTS

| | | | |
|---|---|---|---|
| 5,293,053 A * | 3/1994 | Malhi et al. ................. | 257/330 |
| 5,716,861 A | 2/1998 | Moslehi | |
| 5,902,125 A | 5/1999 | Wu | |
| 6,087,235 A | 7/2000 | Yu | |
| 6,127,232 A * | 10/2000 | Chatterjee et al. ........... | 438/291 |
| 2004/0063313 A1* | 4/2004 | Shiratake et al. ........... | 438/672 |
| 2004/0142529 A1* | 7/2004 | Park ......................... | 438/256 |

FOREIGN PATENT DOCUMENTS

| KR | 1020020011549 | 2/2002 |
|---|---|---|
| KR | 1020030048210 | 6/2003 |

OTHER PUBLICATIONS

Korean Notice to File a Response/Amendment to the Examination Report, Feb. 28, 2006.
English Translation of Response/Amendment to the Examination Report, Feb. 28, 2006.

* cited by examiner

*Primary Examiner*—Edward Wojciechowicz
(74) *Attorney, Agent, or Firm*—Myers Bigel Sibley & Sajovec, P.A.

(57) ABSTRACT

Methods of forming an electronic device may include forming a gate electrode on a semiconductor substrate, and forming first and second impurity doped regions of the semiconductor substrate on opposite sides of the gate electrode. An insulating layer may be formed on the semiconductor substrate including the first and second impurity doped regions, and first and second holes may be formed in the insulating layer, with the first and second holes respectively exposing portions of the first and second impurity doped regions. In addition, first and second epitaxial semiconductor layers may be formed in the respective first and second holes on the exposed portions of the first and second impurity doped regions of the semiconductor substrate. Related devices are also discussed.

5 Claims, 5 Drawing Sheets

METHODS OF FORMING ELECTRONIC DEVICES HAVING PARTIALLY ELEVATED SOURCE/DRAIN STRUCTURES

CROSS-REFERENCE TO RELATED APPLICATIONS

This U.S. non-provisional patent application claims the benefit of priority as a divisional of U.S. patent application Ser. No. 11/020,311 filed Dec. 22, 2004, which claims the benefit of and priority under 35 U.S.C. § 119 to Korean Patent Application 2004-64400 filed on Aug. 16, 2004. The disclosures of the above referenced U.S. and Korean applications are hereby incorporated herein in their entirety by reference.

FIELD OF THE INVENTION

The present invention relates to semiconductor devices, and more particularly to high voltage semiconductor devices and related methods.

BACKGROUND

Semiconductor devices require a suitable operation voltage according to the characteristics thereof. With continuous advancement in developing device technologies to reduce power consumption, internal voltages have been reduced. However, there may be a need for devices or logic circuits operable at relatively high voltages. Flash memory devices, for example, may need high writing and/or erasing voltages. High voltage transistors may thus be integrated into flash memory devices to supply such a high voltage to a cell array and/or to pump a low voltage up to a high voltage.

A junction of a high voltage transistor may be formed using an LDD (lightly doped drain) structure or a DDD (double doped drain) structure. There may be limits to manufacturing more highly integrated devices capable of resisting high voltages using such junction structures. If the depth of a low-concentration diffusion layer is reduced for the purpose of overcoming a short-channel effect, for example, a junction breakdown between a high-concentration diffusion layer and a substrate may result. If a concentration distribution of a high-concentration diffusion layer is alleviated to overcome junction breakdown, an effective area of the high-concentrated diffusion layer may increase.

An elevated source/drain technology has thus been developed with an epitaxial layer being formed on a substrate and impurities being implanted into the epitaxial layer. Korean Patent Publication No. 2001-109783 and U.S. Pat. No. 6,087,235 disclose methods of fabricating a transistor with an elevated source/drain structure being formed using selective epitaxial growth. FIGS. 1 through 3 are cross-sectional views illustrating a conventional method of fabricating a transistor.

Referring to FIG. 1, in the conventional transistor, a field isolation film 121 is formed in a semiconductor substrate 102 to define an active region. A gate insulation layer 302 is formed on the active region, and a conductive gate layer 304 is formed on the gate insulation layer 302. A capping layer 309 is formed on the gate layer 304. A drain diffusion region 306 and a source diffusion region 308 are formed by implanting impurities into the semiconductor substrate 102 at opposite sides of the gate layer 304. First spacers 310 are formed at sidewalls of the gate layer 304. Elevated drain and source contact structures 314 and 316, having a drain facet 318 and a source facet 320 respectively, are formed on the semiconductor substrate 102 beside the first spacers 310.

Referring to FIG. 2, second spacers 330 are formed at both sides of the gate layer 304, covering the source facet 320 and the drain facet 318. The capping layer 309 is etched away from the gate layer 304. Impurities are implanted into the elevated drain contact structure 314 and the elevated source contact structure 316. Portions of the substrate 102 adjacent to the gate layer 304 may be shielded from the implanted impurities by the second spacers 330.

Referring to FIG. 3, a drain silicide layer 340 is formed on the elevated drain contact structure 314, a source silicide layer 342 is formed on the elevated source contact structure 316, and a gate silicide layer 344 is formed on the elevated gate contact structure 304. An inter-level insulation layer 354 is deposited on the resultant structure for electrical isolation of components of the transistor 300. Next, drain and source contacts 350 and 352 are formed to provide connections to the drain and source silicide layers 340 and 342 passing through the inter-level insulation layer 354.

In the conventional transistor architecture described above, the impurity implantation is performed to dope the elevated drain contact structure 314 and the elevated source contact structure 316 to form a drain region and a source region. Accordingly, the source and drain low-concentration diffusion regions may be shallowly formed on the substrate to reduce short-channel effects. Further, since the second spacers 330 cover the source and drain facets 320 and 318 and the high-concentration impurities are implanted into the elevated drain and source contact structures, an impurity layer may not be formed deeply in lower portions of the source and drain facets 320 and 318. A silicon layer, however, may be grown with crystallization between the gate layer and the impurity layer. Thus, when a high voltage is applied to the source contact or the drain contact, an electric field may be exerted on the silicon layer between the gate layer and the impurity layer. More particularly, when a voltage of 10 to 20 volts or higher is applied to the source contact or the drain contact, the voltage may be provided through the silicon layer to cause an increase of a gate potential. An increase of the gate potential due to a source or drain voltage may thus be reduced by enlarging a thickness of the gate spacer. There may be limits, however, to extending thicknesses of gate spacers in highly integrated circuit devices.

SUMMARY OF THE INVENTION

According to some embodiments of the present invention, methods of forming an electronic device may include forming a gate electrode on a semiconductor substrate, and forming first and second impurity doped regions of the semiconductor substrate on opposite sides of the gate electrode. An insulating layer may be formed on the semiconductor substrate including the first and second impurity doped regions, and first and second holes may be formed in the insulating layer. More particularly, the first and second holes may respectively expose portions of the first and second impurity doped regions. In addition, first and second semiconductor layers may be formed in the respective first and second holes on the exposed portions of the first and second impurity doped regions of the semiconductor substrate.

Forming the first and second semiconductor layers may include forming first and second epitaxial semiconductor layers, and a crystal structure of the first and second semiconductor layers may be aligned with respect to a crystal structure of the semiconductor substrate. Moreover, forming the insulating layer may include forming the insulating layer on the gate electrode such that the gate electrode is between the insulating layer and the semiconductor substrate. In addition, the first and second impurity doped regions of the semiconductor substrate may have impurity concentrations that are less than impurity concentrations of at least portions of the respective first and second semiconductor layers.

After forming the first and second semiconductor layers, first and second conductive plugs may be formed in the respective first and second holes on the respective first and second semiconductor layers. More particularly, each of the first and second conductive plugs may include doped polysilicon. In addition or in an alternative, each of the first and second conductive plugs may include a metal, and the first and second conductive plugs may be in ohmic contact with the respective first and second semiconductor layers.

Before forming the insulating layer, sidewall spacers may be formed on sidewalls of the gate electrode such that a sidewall spacer and portions of the insulating layer are between the gate electrode and each of the first and second semiconductor layers. Moreover, an impurity dopant concentration of each of the first and second semiconductor layers may increase with increasing distance from the semiconductor substrate. In addition, a gate insulating layer may be formed such that the gate insulating layer is between the gate electrode and the semiconductor substrate.

According to additional embodiments of the present invention, an electronic device may include a semiconductor substrate and a gate electrode on the semiconductor substrate. The first and second impurity doped regions of the semiconductor substrate may be on opposite sides of the gate electrode, and an insulating layer may be on the semiconductor substrate including the first and second impurity doped regions. More particularly, the insulating layer may have first and second holes therein respectively exposing portions of the first and second impurity doped regions. In addition, first and second semiconductor layers may be in the respective first and second holes on the exposed portions of the first and second impurity doped regions of the semiconductor substrate.

The first and second semiconductor layers may be first and second epitaxial semiconductor layers, and the insulating layer may be on the gate electrode such that the gate electrode is between the insulating layer and the semiconductor substrate. The first and second impurity doped regions of the semiconductor substrate may have impurity concentrations that are less than impurity concentrations of at least portions of the respective first and second semiconductor layers.

First and second conductive plugs may be provided in the respective first and second holes such that the first and second semiconductor layers are between the respective first and second conductive plugs and the first and second impurity doped regions of the semiconductor substrate. More particularly, each of the first and second conductive plugs may include doped polysilicon. In addition or in an alternative, each of the first and second conductive plugs may include a metal, and the first and second conductive plugs may be in ohmic contact with the respective first and second semiconductor layers.

Sidewall spacers may be provided on sidewalls of the gate electrode such that a sidewall spacer and portions of the insulating layer are between the gate electrode and each of the first and second semiconductor layers. Moreover, an impurity dopant concentration of each of the first and second semiconductor layers may increase with increasing distance from the semiconductor substrate. In addition, a gate insulating layer may be provided between the gate electrode and the semiconductor substrate.

According to some embodiments of the present invention, transistor structures and methods may be provided which reduce short-channel effects and elevate junction breakdown voltages without increasing an area of a high-concentration diffusion region. Transistor structures and methods may also be provided which regulate a potential change of a gate electrode due to a high voltage applied to a high-concentration diffusion region.

According to some embodiments of the present invention, a transistor may be provided having a partially elevated source/drain structure. The transistor may include a gate electrode formed on a semiconductor substrate and a low-concentration diffusion region formed in the semiconductor substrate around both sides of the gate electrode. An inter-level insulation film may be formed on an entire surface of the semiconductor substrate on which the gate electrode and the low-concentrated diffusion region are formed. The inter-level insulation film may have contact holes penetrating the low-concentration diffusion region to reach the semiconductor substrate. An epitaxial layer may be formed on a part of the semiconductor in the contact holes. A high-concentration diffusion region may be formed in the epitaxial layer. A contact pattern may fill the contact holes on the epitaxial layer.

The transistor may further include sidewall spacers formed at sidewalls of the gate electrode. Accordingly, the inter-level insulation film may be sandwiched between the sidewall spacers and the epitaxial layer. The high-concentration diffusion region may extend to the semiconductor substrate with a predetermined depth, and its concentration may become gradually higher away from the low-concentrated diffusion region. The contact pattern may be formed of a doped polysilicon or metal pattern. When the contact pattern is formed by metal, the contact pattern and the epitaxial layer may be in ohmic contact with each other.

According to more embodiments of the present invention, methods of fabricating a transistor having a partially elevated source/drain structure may be provided. The method may include forming a gate layer on a semiconductor substrate and implanting low-concentration impurities into the semiconductor substrate around both sides of the gate layer to form a low-concentration diffusion region. An inter-level insulation film may be formed on an entire surface of the semiconductor substrate on which the low-concentration diffusion region is formed. The inter-level insulation film may be patterned to form contact holes exposing the semiconductor substrate on which the low-concentration diffusion region is formed. An epitaxial layer may be grown on portions of the semiconductor substrate exposed by the contact holes. High-concentration impurities may be implanted into the epitaxial layer to form a high-concentration diffusion region. A contact pattern filling the contact holes may be formed. During growth of the epitaxial layer, impurities may be implanted with a gradually increasing concentration. The high-concentration diffusion region may extend a predetermined depth into the semiconductor substrate.

BRIEF DESCRIPTION OF THE DRAWINGS

The accompanying drawings are included to provide a further understanding of the invention, and are incorporated in and constitute a part of this specification. The drawings illustrate examples of embodiments of the present invention and, together with the description, serve to explain principles of the present invention.

DETAILED DESCRIPTION

Figure 1:
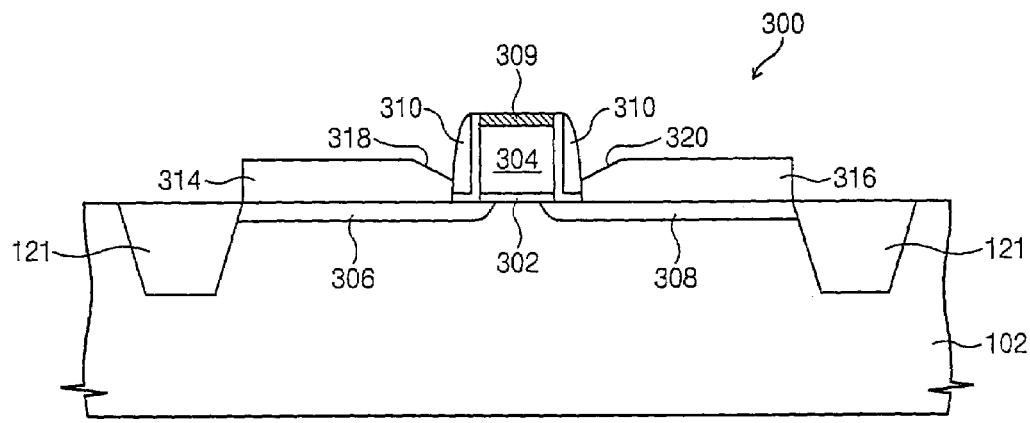
FIGS. 1 through 3 are cross-sectional views illustrating a conventional method of fabricating a transistor.
Figure 2:
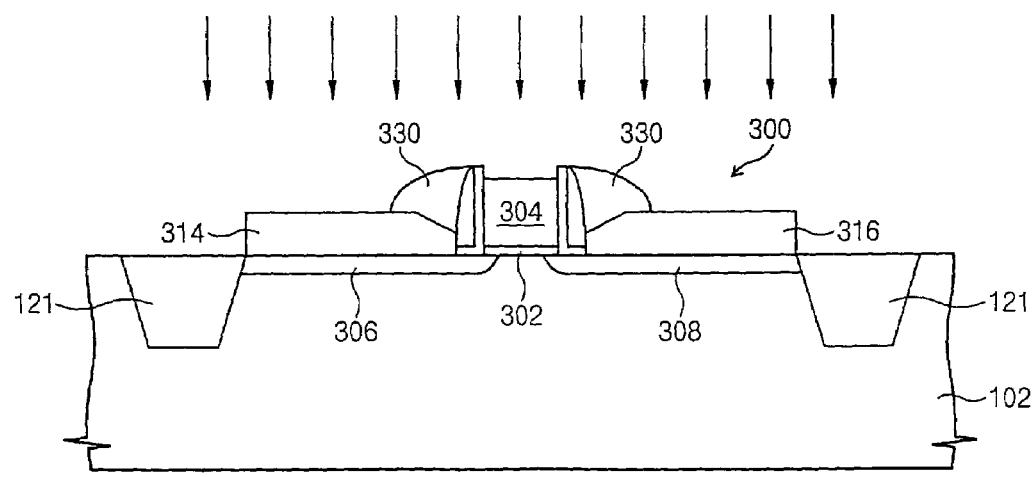
Figure 3:
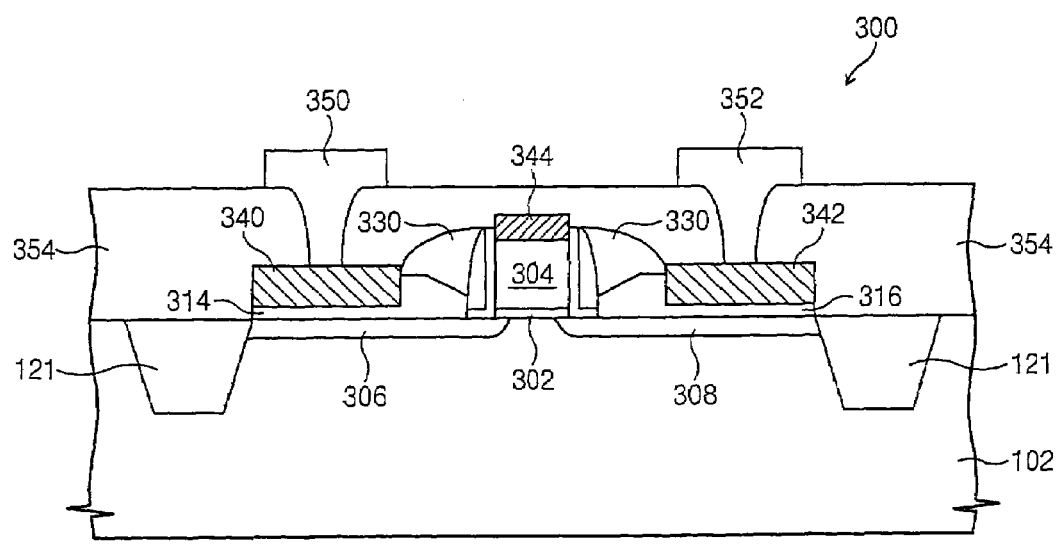

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompass both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
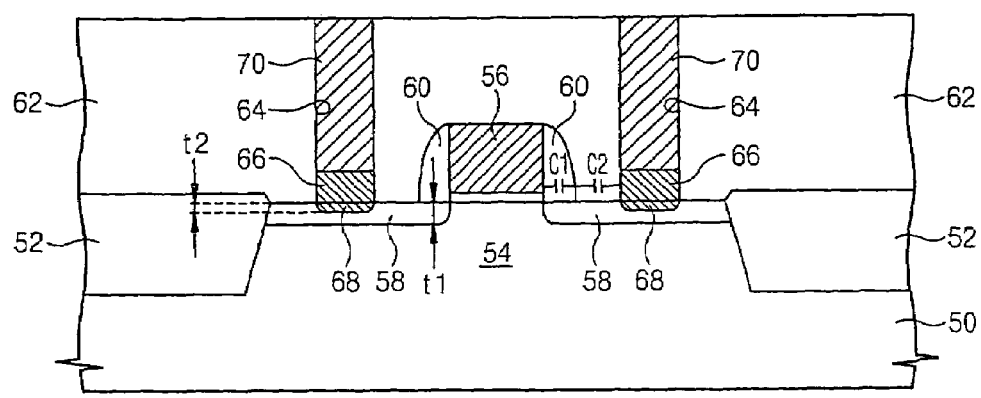
FIG. 4 is a cross-sectional view illustrating transistors according to some embodiments of the present invention.

FIG. 4 is a cross-sectional view illustrating a transistor according to some embodiments of the present invention.

Referring to FIG. 4, a field isolation film 52 may be formed on a semiconductor substrate 50 to define an active region 54. A transistor may be formed at the active region 54, and a gate electrode 56 may be formed on the active region 54.

Shallow low-concentration impurity doped regions 58 of a depth t1 may be formed in the active region 54 around both sides of the gate electrode 56. Sidewall spacers 60 may be formed at sidewalls of the gate electrode 56. An epitaxial layer 66 may be selectively grown on a part of each shallow impurity doped region 58. High-concentration impurity doped regions 68 may be formed at the epitaxial layer 66. The high-concentration impurity doped regions 68 may extend to a predetermined depth t2 of the semiconductor substrate 50. The epitaxial layer 66 may be formed in contact holes 64 penetrating inter-level insulation film 62 covering the semiconductor substrate 50. Accordingly, portions of the inter-level insulation film 62 separate the epitaxial layer 66 and the gate electrode 56. When a sidewall spacer 60 is formed at sidewalls of the gate electrode 56, the inter-level insulation film 62 may separate the sidewall spacer 60 and the epitaxial layer 66.

Upper portions of the epitaxial layers 66 in the contact holes 64 may be filled with contact patterns 70. Each of the contact patterns 70 may be formed using doped polysilicon and/or a metal. Since the epitaxial layer 66 is doped to a higher concentration, the epitaxial layer 66 and a material used as the contact pattern 70 may be in ohmic contact with one another.

As shown in FIG. 4, parasitic capacitors C1 and C2 are formed between the epitaxial layer 66 and the gate electrode 56. The parasitic capacitors C1 and C2 may be modeled as serially connected capacitors using an inter-level insulation film and a sidewall spacer as dielectric films. According to embodiments of the present invention, since an inter-level insulation film is provided between a doped epitaxial layer and a sidewall spacer, elevation of the gate voltage may be reduced because of a voltage drop in the inter-level insulation film. A thickness of the sidewall spacer may thus be reduced and/or a separate sidewall spacer may be eliminated to lessen an effective area of the transistor.

The high-concentration impurity doped region 68 may have a concentration distribution that is higher away from a boundary with the low-concentrated impurity doped region 58. This distribution pattern may be achieved by forming an epitaxial layer having an impurity concentration that gradually increases from a lower portion to an upper portion. In other words, since the epitaxial layer 66 may have a concentration distribution that increases gradually from a lower portion to an upper portion, a concentration of the high-concentration impurity doped region 68 formed at the epitaxial layer 66 may gradually increase from a lower portion to an upper portion. As the high-concentration impurity doped region 68 extending to the semiconductor substrate 50 comes nearer to the boundary with the low-concentrated impurity doped region 58, the concentration thereof may gradually reduce.

FIGS. 5 through 9 are cross-sectional views illustrating steps of fabricating a transistor according to embodiments of the present invention.

Figure 5:
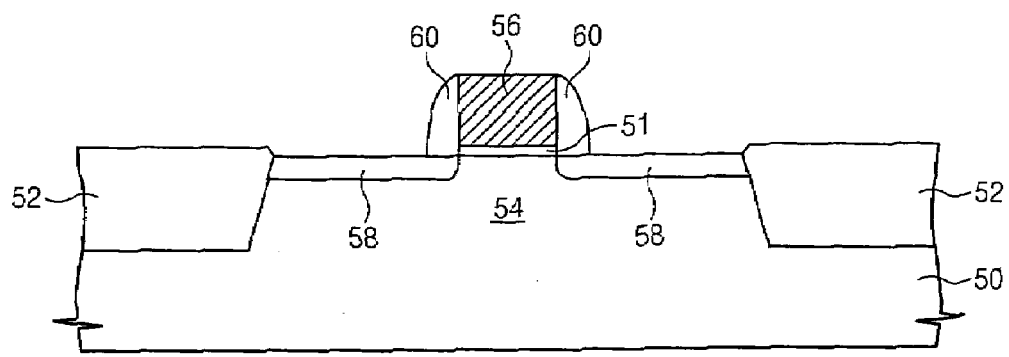
FIGS. 5 through 9 are cross-sectional views illustrating steps of fabricating transistors according to some embodiments of the present invention.

Referring to FIG. 5, field isolation film(s) 52 are formed in a semiconductor substrate 50 to define an active region 54. A gate insulation layer 51 is formed on the active region 54, and a gate electrode 56 is formed on the gate insulation layer 51. Low-concentration impurities are implanted into the semiconductor substrate 50 at both sides of the gate electrode 56 to form low-concentration impurity doped regions 58. In addition or in an alternative, impurity doped regions 58 may be formed using diffusion. To reduce extension of the low-concentration impurity doped regions 58 to a lower portion of the gate electrode 56, the low-concentration impurities may be shallowly implanted. Additionally, sidewall spacers 60 can be formed at sidewalls of the gate electrode 56.

Figure 6:
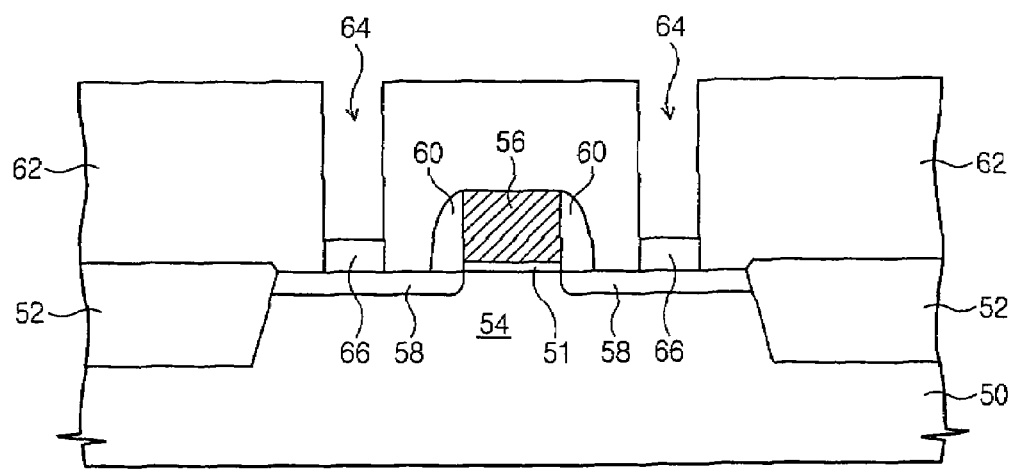

Referring to FIG. 6, an inter-level insulation film 62 may be formed on an entire surface of the semiconductor substrate 50. The inter-level insulation film 62 may be patterned to form contact holes 64 exposing portions of the impurity doped regions 58 of a lower concentration. Epitaxial layers 66 may be formed on portions of the semiconductor substrate 50 exposed through contact holes 64. The epitaxial layers 66 can be grown using selective epitaxial growth. During growth of the epitaxial layers 66, the epitaxial layers 66 may be doped in situ using an impurity source during deposition. In addition or in an alternative, the epitaxial layer may be doped using ion implantation and/or diffusion. During growth of the epitaxial layer 66, the epitaxial layer 66 may have an impurity concentration distribution that gradually increases from the lower portion to the higher portion. By doing this, a high-concentration impurity doped region to be formed later may provide a coupling with the low-concentration impurity doped region 58 without an abrupt variation of an electric field. Since the epitaxial layers 66 may be partially formed in the contact hole 64, a partially elevated source/drain structure can be formed on the active region 54.

Figure 7:
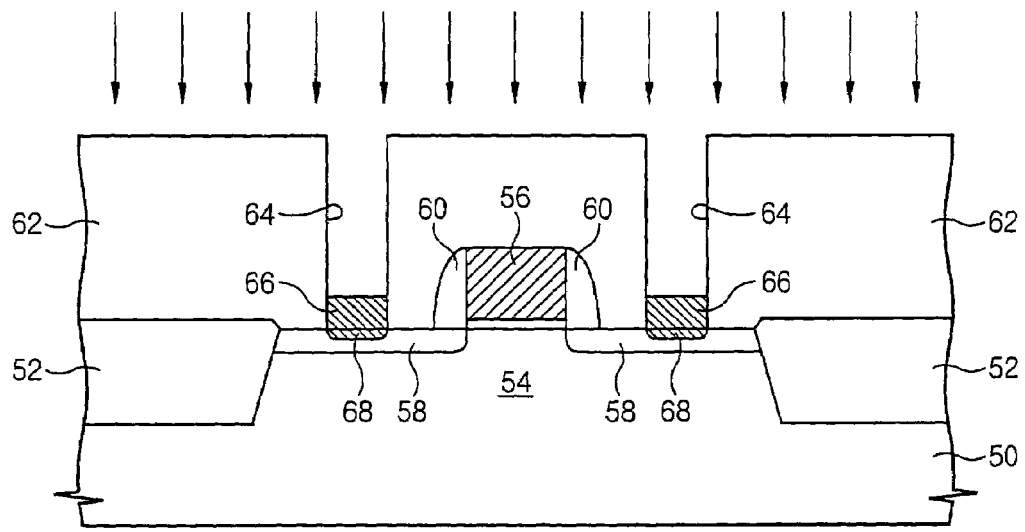

Referring to FIG. 7, by implanting a high-concentration of impurities into a resulting structure in which the epitaxial layers 66 have been formed, an impurity doped layer 68 having a relatively high concentration may be provided at the epitaxial layers 66. Since the epitaxial layers 66 may provide a predetermined depth, boundaries may be defined in the low-concentration impurity doped regions 58 into which the high-concentration impurities may extend. Prior to forming the high-concentration impurity doped regions 68, the epitaxial layers 66 may be formed with a concentration profile that decreases from upper portions to the lower portions. Thus, the high-concentration impurity doped regions 68 may also have concentration profiles that decrease gradually from the upper portion of the epitaxial layer 66 to the lower portion thereof. Even when there has not been any prior doping step for the epitaxial layer(s), the high-concentration impurity doped region(s) 68 formed by an impurity implant and/or diffusion may have a concentration profile that is lower near the low-concentration diffusion region(s) 58.

The high-concentration impurity doped region 68 may extend into the semiconductor substrate 50 a predetermined depth. In this case, the nearer the high-concentration impurity doped regions 68 to the low-concentration impurity depend region 58, the lower the concentration thereof. Accordingly, the high-concentration impurity doped regions 68 may have a concentration distribution profiles that are higher away from the boundary of the low-concentration impurity doped region 58.

Figure 8:
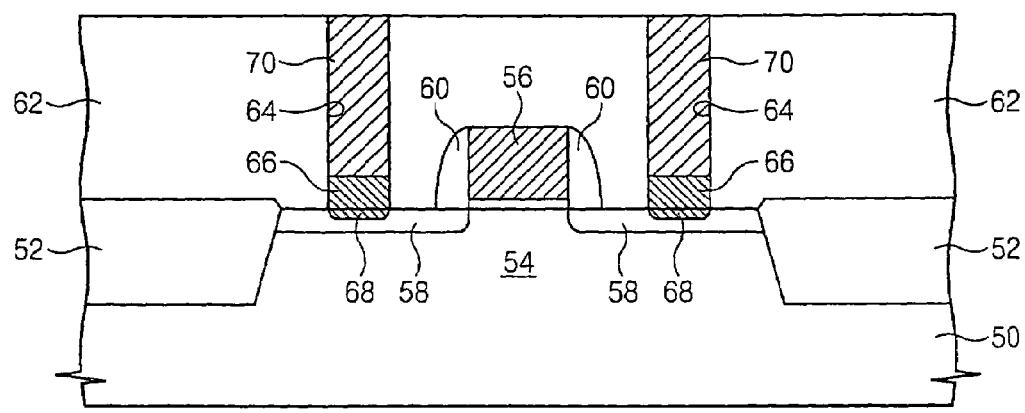

Referring to FIG. 8, the contact holes 64 are filled with a conductive film to form contact patterns 70 connected to the epitaxial layers 66. The contact patterns 70 may be polysilicon plugs. At this time, the polysilicon plugs may be in-situ doped or doped by ion implantation. In an alternative, the contact patterns 70 can be formed of metal.

Figure 9:
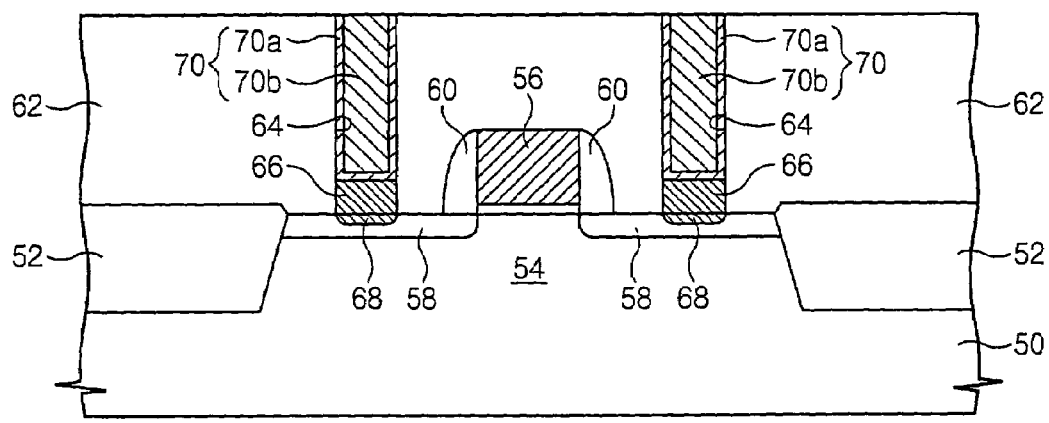

Referring to FIG. 9, contact holes 64 may be filled with metal to form the contact patterns 70. The contact patterns 70 may include metal barrier layers 70a and metal core layers 70b. The metal barrier layers 70a may conformally cover inner walls of the contact holes 64 and upper surfaces of the epitaxial layers 66. The metal barrier layer(s) 70a may be a titanium/titanium nitride film(s). The contact holes 64 in which the metal barrier layers 70a are formed may be filled with the metal layer(s) 70b. The metal layers 70b may include tungsten, tungsten nitride aluminum, and/or copper.

In this case, the contact patterns 70 and the epitaxial layers 66 may be in ohmic contact with each other. The epitaxial layers 66 may be doped at a higher concentration and a metal silicide may be formed at the boundary between the epitaxial layers 66 and the metal barrier layers 70a allowing the contact patterns 70 and the epitaxial layers 66 to be in ohmic contact with each other.

As discussed above, an epitaxial layer is not formed on portions of the semiconductor substrate exposed at opposite sides of a gate electrode before forming an inter-level insulation film. Contact holes exposing a part of the semiconductor substrate may be formed on opposite sides of the gate electrode, and the epitaxial layers may be formed on exposed portions of the substrate. Accordingly, the epitaxial layers may be formed at portions of impurity doped regions having a lower concentration but the epitaxial layers may be spaced apart from portions of the substrate in the vicinity of a gate electrode and/or a sidewall spacer.

Such a structure according to embodiments of the present invention may provide a potential barrier by an inter-level insulation film separating the epitaxial layer(s) and the gate electrode. Accordingly, although a high voltage may be applied to the epitaxial layer(s), a voltage drop due to an inter-level insulation film separating the epitaxial layer(s) and the gate electrode may reduce voltage increases at the gate electrode.

In addition, since there may be a parasitic capacitor of relatively low capacitance between the gate electrode and the epitaxial layer, fluctuations of a gate potential due to electrical signals from the source and/or drain regions may be reduced.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A method of fabricating a transistor, comprising:
    forming a gate layer on a semiconductor substrate;
    implanting low-concentrated impurities into the semiconductor substrate around both sides of the gate layer to form a low-concentrated diffusion region;
    forming an inter-level insulation film on an entire surface of the semiconductor substrate on which the low-concentrated diffusion region is formed;
    patterning the inter-level insulation film to form contact holes exposing the semiconductor substrate on which the low-concentrated diffusion region is formed;
    growing an epitaxial layer on the semiconductor substrate exposed by the contact holes; and
    forming a contact pattern to fill the contact holes;
    wherein during the growth of the epitaxial layer, impurities are implanted while gradually increasing a concentration of the impurities so that an impurity dopant concentration of the epitaxial layer increases with increasing distance from the semiconductor substrate.

2. The method as set forth in claim 1, wherein the contact pattern is formed of polysilicon.

3. The method as set forth in claim 1, wherein forming the contact pattern includes:
    forming a metal barrier layer conformally covering the contact holes; and
forming a metal layer filling the contact holes in which the metal barrier layer is formed.

4. The method as set forth in claim 1 wherein during the growth of the epitaxial layer, impurities are implanted while gradually increasing a concentration of the impurities so that an impurity dopant concentration of the epitaxial layer increases with increasing distance from the semiconductor substrate.

5. A method of forming an electronic device, the method comprising:

forming a gate electrode on a semiconductor substrate;

forming first and second impurity doped regions of the semiconductor substrate on opposite sides of the gate electrode;

forming an insulating layer on the semiconductor substrate including the first and second impurity doped regions;

forming first and second holes in the insulating layer, the first and second holes respectively exposing portions of the first and second impurity doped regions; and forming first and second epitaxial semiconductor layers in the respective first and second holes on the exposed portions of the first and second impurity doped regions of the semiconductor substrate;

wherein an impurity dopant concentration of each of the first and second epitaxial semiconductor layers increases with increasing distance from the semiconductor substrate;

wherein during the growth of the epitaxial layer, impurities are implanted while gradually increasing a concentration of the impurities so that the impurity dopant concentration of each of the first and second epitaxial semiconductor layers increases with increasing distance from the semiconductor substrate.

* * * * *